United States Patent
Maekawa

[11] Patent Number: 6,163,056
[45] Date of Patent: Dec. 19, 2000

[54] SEMICONDUCTOR DEVICE HAVING ELECTROSTATIC DISCHARGE

[75] Inventor: Hisayuki Maekawa, Tokyo, Japan

[73] Assignee: Oki Electric Industry Co., Ltd., Tokyo, Japan

[21] Appl. No.: 09/336,750

[22] Filed: Jun. 21, 1999

[30] Foreign Application Priority Data

Jul. 2, 1998 [JP] Japan .................................. 10-187750

[51] Int. Cl.$^7$ .................................................. H01L 23/62
[52] U.S. Cl. .......................... 257/355; 257/358; 257/359; 257/360; 257/363; 257/546
[58] Field of Search .................................. 257/355, 359, 257/358, 357, 360, 546

[56] References Cited

U.S. PATENT DOCUMENTS

| 4,692,781 | 9/1987 | Rountree et al. | 357/23.11 |
|---|---|---|---|
| 4,760,433 | 7/1988 | Young et al. | 357/23.13 |
| 5,338,986 | 8/1994 | Kurimoto | 307/303.2 |
| 5,486,716 | 1/1996 | Saito et al. | 257/360 |
| 5,514,893 | 5/1996 | Miyanaga et al. | 257/360 |
| 5,543,650 | 8/1996 | Au et al. | 257/355 |
| 5,559,352 | 9/1996 | Hsue et al. | 257/352 |
| 5,581,103 | 12/1996 | Mizukami | 257/355 |
| 5,623,156 | 4/1997 | Watt | 257/355 |
| 5,701,024 | 12/1997 | Watt | 257/360 |
| 5,710,452 | 1/1998 | Narita | 257/355 |
| 5,739,998 | 4/1998 | Wada | 361/56 |
| 5,767,552 | 6/1998 | Casper | 257/379 |
| 5,963,409 | 10/1999 | Chang et al. | 361/56 |
| 6,064,093 | 5/2000 | Ohta | 257/355 |

*Primary Examiner*—Matthew Smith
*Assistant Examiner*—Belur Keshavan
*Attorney, Agent, or Firm*—Jones Volentine, LLC

[57] ABSTRACT

A semiconductor device includes a semiconductor substrate having a major surface, a source region of a second conductivity type, a drain region of the second conductivity type, and a first insulating layer formed over the major surface between the source region and the drain region. The device also includes a control electrode layer formed over the first insulating layer and a second insulating layer formed over the major surface. The device also includes a first wiring layer formed in the first contact hole and a second wiring layer formed in the second contact hole and connected to a pad and an internal circuitry, wherein the internal circuitry executes a predetermined operation and wherein the pad receives a signal from the internal circuitry or a signal from an external device.

29 Claims, 17 Drawing Sheets

SEMICONDUCTOR DEVICE HAVING ELECTROSTATIC DISCHARGE

BACKGROUND OF THE INVENTION

1. Field of the Invention

The present invention generally relates to a semiconductor device, and more particularly, to a MOS transistor in an electrostatic discharge protection circuit that protects an internal circuitry comprising MOS transistors from an electrostatic discharge damage.

This application relies for priority on Japanese patent application, Serial Number 187750/1998 filed Jul. 2, 1998, which is incorporated herein by reference in its entirety.

2. Description of the Related Art

In general, a MOS transistor is used for a logic circuit. The MOS transistor is also used as an element for an electrostatic discharge protection circuit formed in an area close to a signal input/output circuit or the like. The MOS transistor prevents circuitry from breaking due to an electrostatic discharge from an external environment.

FIG. 1 is a circuit diagram showing the protection circuit.

The protection circuit includes a PMOS transistor 200 and an NMOS transistor 202, and is located at an input side of an internal circuitry 206 or the like (for example, a logic circuit), which includes MOS transistors. A drain of the PMOS transistor 200 is connected to a drain of the NMOS transistor 202. A source, a gate, and a substrate (i.e., a back gate or a bulk) of the PMOS transistor 200 are commonly connected to one another and are supplied with a power supply voltage VDD. A source, a gate, and a substrate (i.e., a back gate or a bulk) of the NMOS transistor 202 are commonly connected to one another and maintained at a ground voltage GND. A node P, which is connected to the PMOS transistor 200 and the NMOS transistor 202, is connected to a pad 204 and the internal circuitry 206.

In a general MOS transistor structure, a parasitic bipolar transistor is present in which the source of the MOS transistor forms an emitter, the drain of the MOS transistor forms a collector and the substrate of the MOS transistor forms a base. As shown in FIG. 1, the behavior of the MOS transistors which functions as protection elements is as follows. In the case of the NMOS transistor 202 as an example, when the electrostatic voltage (i.e., a surge voltage) having positive polarity is applied to an n-type drain diffusion layer of the NMOS transistor 202 through the node P, an avalanche breakdown occurs at a p-n junction between the n-type drain diffusion layer and a p-type substrate. At this time, an avalanche current results from the avalanche breakdown and the current flows into the substrate. Since a voltage potential of the substrate is raised by the avalanche current, a junction between an n-type source diffusion layer and the p-type substrate become conductive. Then, the NPN parasitic bipolar transistor, which is formed by the NMOS transistor 202 used as the protection element, begins to conduct. As a result, a withstanding voltage (i.e., a break down voltage) of the protection element is indicated as an emitter-collector withstanding voltage BVceo of the parasitic bipolar transistor. Since the emitter-collector withstanding voltage BVceo is set at a predetermined value that is smaller than that of a withstanding voltage BVsd of the MOS transistor in the internal circuitry 206, the breakdown caused by the surge voltage occurs only at the protect element. Therefore, a surge current caused by the surge voltage flows to the ground voltage GND through the NMOS transistor 202.

As explained above, the protection element using the MOS transistor protects the internal circuitry 206 from the surge voltage by utilizing the parasitic bipolar transistor.

In the above described protection element, the surge current spreads toward the gate width direction. The gate width is enlarged to decrease a current density per unit gate width, and so a heat malfunction (i.e., a thermal runaway) caused by the current crowding is prevented and the withstanding voltage against the electrostatic discharge is improved.

However, in order to satisfy the withstanding voltage amount against the electrostatic discharge which is standardized, e.g., by the Japanese Industrial Standard, a gate width with several hundreds of micrometers is needed. Therefore, a problem arises that the area of the protection element becomes large. A circuit designer may design the protection element so that it has a interleaved comblike form as illustrated in FIG. 2 to reduce the element area. As shown in FIG. 2, a gate electrode 210 and a common wiring 212 are formed. The common wiring 212 is commonly connected to a source region, the gate electrode 210 and a substrate. Furthermore, a drain wiring 214, which is connected to a drain region, is formed. The gate electrode 210, the common wiring 212 and the drain wiring 214 are shaped into the comblike form.

The protection element includes contact holes where conductive materials are formed therein. The conductive materials connect the source region to the common wiring 212. The conductive materials also connect the drain region to the drain wiring 214. The conductive materials also connect the gate electrode to the common wiring 212.

Therefore, the size of the source and the drain regions must be formed in consideration of the need for an alignment margin when the contact holes are formed.

Consequently, there has been a need for an improved semiconductor device.

SUMMARY OF THE INVENTION

It is an object of the present invention is to provide a semiconductor device having a smaller size.

It is another object of the present invention to provide a semiconductor device which include a protection element having a smaller size.

According to an aspect of the present invention, for achieving one or more of the above objects, there is provided a semiconductor device that includes a semiconductor substrate having a major surface and including a first region of a first conductivity type, wherein the first region is formed in the major surface.

The device further includes a first source region of a second conductivity type, formed in the first region, a first drain region of the second conductivity type, formed in the first region and spaced from the source region, a first insulating layer formed over the major surface between the first source region and the first drain region, and a first control electrode layer formed over the first insulating layer.

The device also includes a second insulating layer formed over the first region and having first and second contact holes defined in the second insulating layer, wherein the first contact hole exposes a portion of the first source region and a portion of the first control electrode, and wherein the second contact hole expose a portion of the first drain region.

The device further includes an internal circuitry executing a predetermined operation and a pad receiving a signal from the internal circuitry or a signal from an external device, a first wiring layer formed in the first contact hole and applied with a first supply voltage level, and a second wiring layer formed in the second contact hole and connected to the pad and the internal circuitry.

The above and further objects and novel features of the invention will more fully appear from the following detailed description, appended claims, and accompanying drawings.

DETAILED DESCRIPTION OF THE PREFERRED EMBODIMENTS

First Preferred Embodiment

Figure 1:
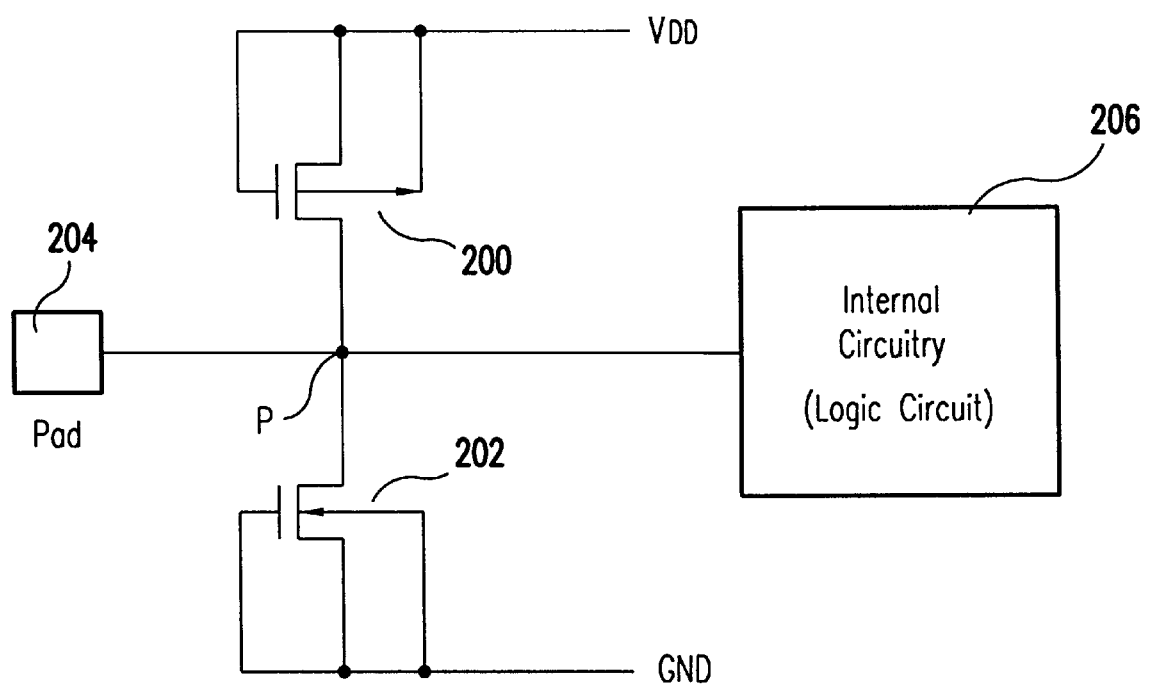
FIG. 1 is an equivalent circuit diagram showing a conventional protection circuit.
Figure 2:
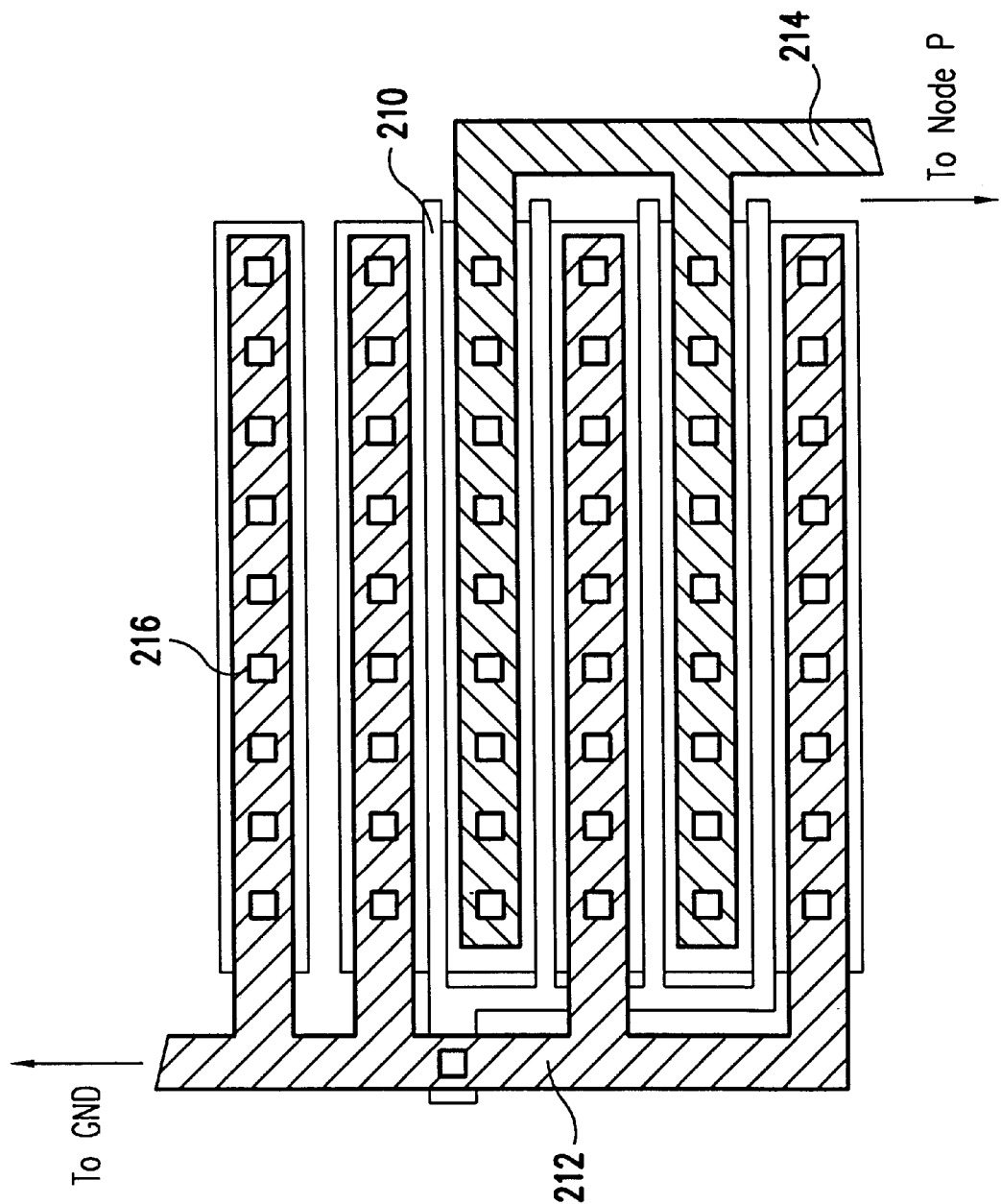
FIG. 2 is a top plan view showing a conventional protection circuit.

A semiconductor device according to the present invention will be explained hereinafter with reference to figures. In order to simplify explanations, like elements are given like or corresponding reference numerals through this specification and figures.

Figure 5:
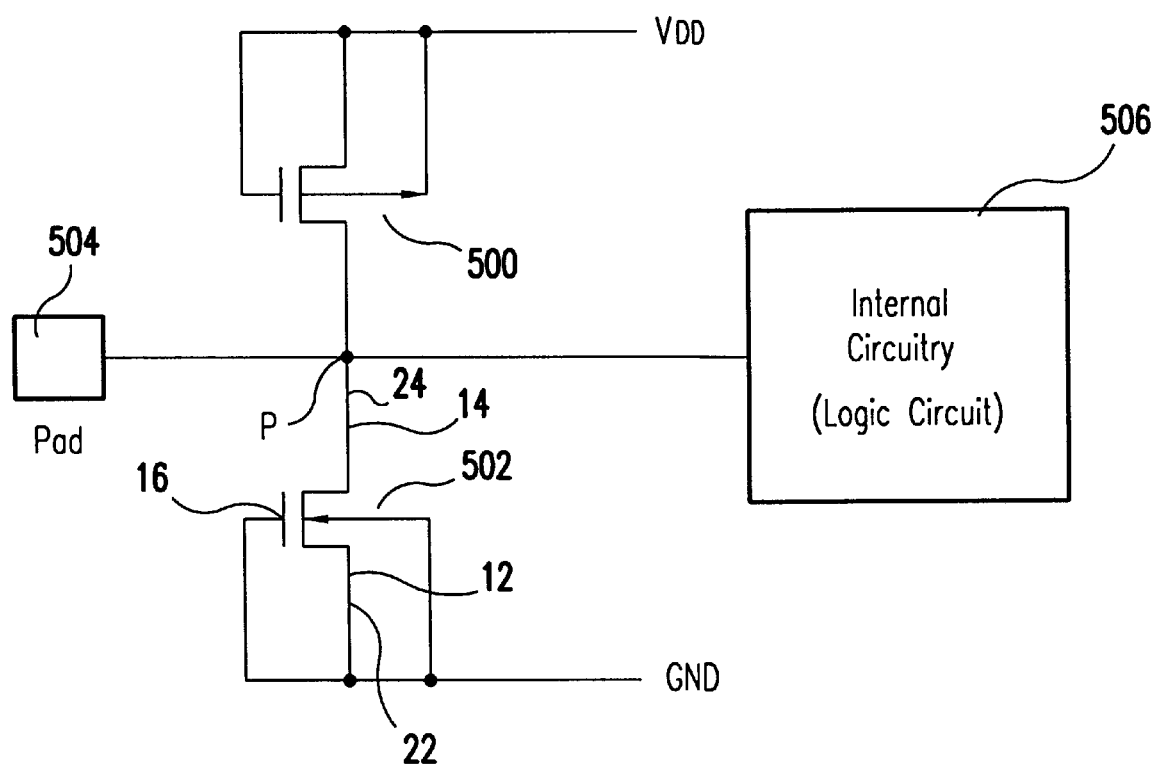
FIG. 5 is an equivalent circuit diagram according to a first preferred embodiment of the present invention.

FIG. 5 is an equivalent circuit diagram showing a semiconductor device according to a first preferred embodiment.

As shown in FIG. 5, the semiconductor device according to the first preferred embodiment includes an NMOS transistor 502, a PMOS transistor 500, a pad 504, and an internal circuitry 506. In order to simplify explanations, since the PMOS transistor 200 and the NMOS transistor 502 have comparable structure, the explanations of the PMOS transistor 200 will be omitted.

Figure 3:
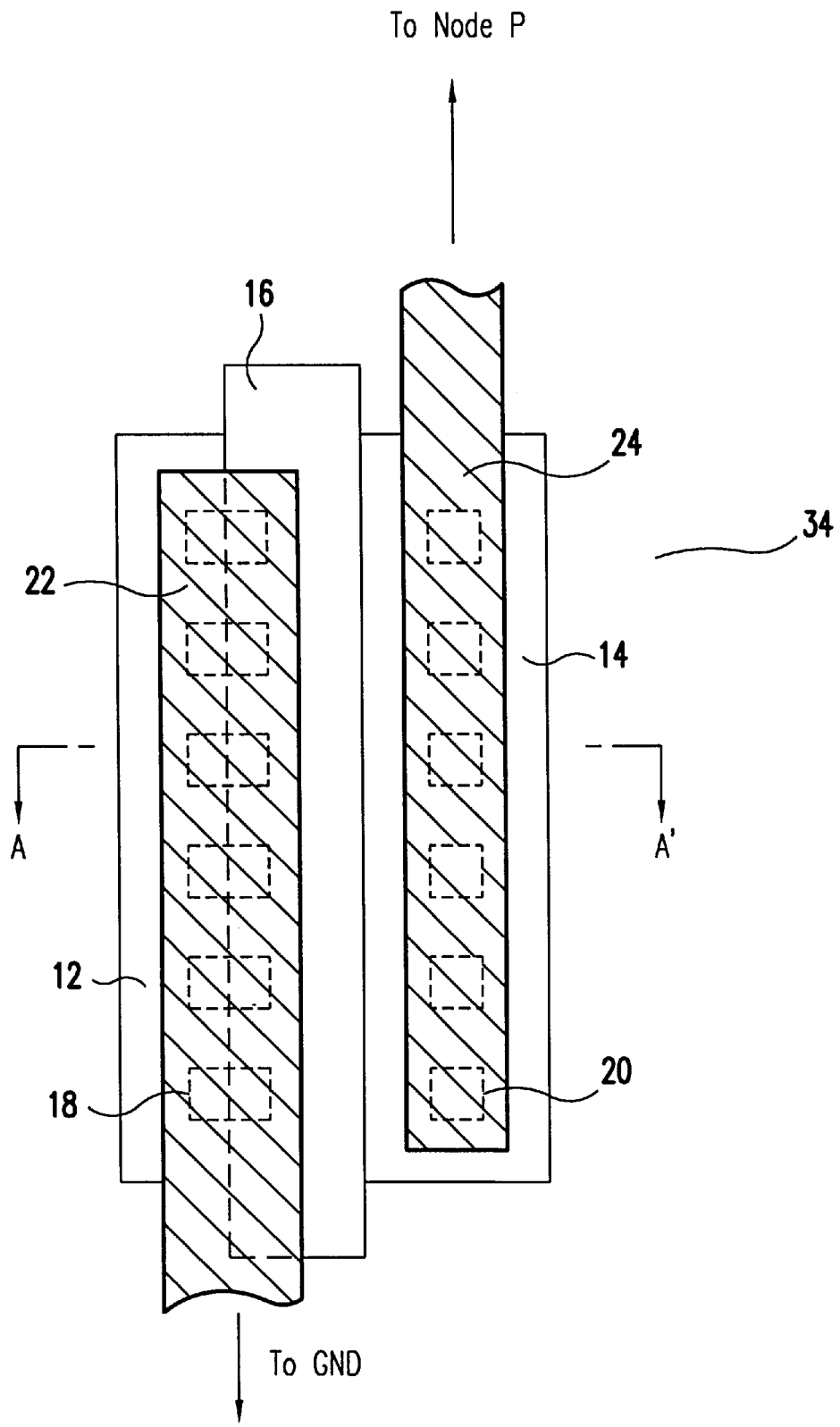
FIG. 3 is a top plan view showing a semiconductor device according to a first preferred embodiment of the present invention.
Figure 4:
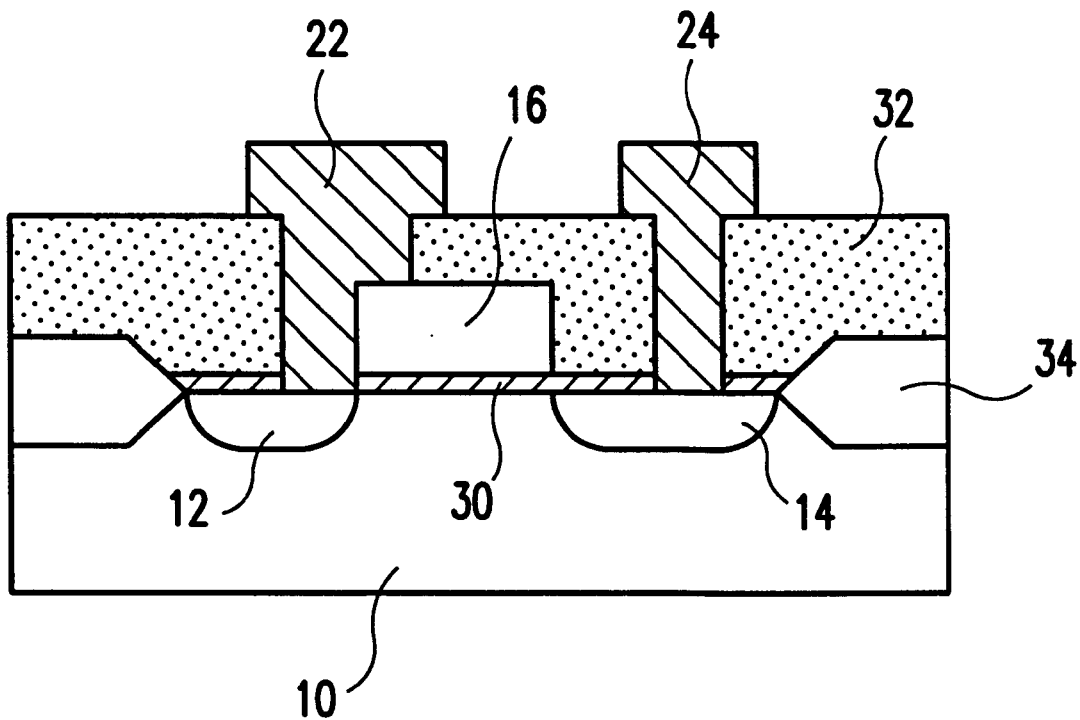
FIG. 4 is a cross sectional view taken on line A–A' of FIG. 3.

FIG. 3 is a top plan view showing a semiconductor device according to the first preferred embodiment. FIG. 4 is a cross sectional view taken on line A–A' of FIG. 3.

In these figures, an n-type source region 12 and an n-type drain region 14 are formed on a major surface of a p-type semiconductor substrate 10 so that the source region 12 and the drain region 14 are formed apart from each other. A gate oxide layer 30 is formed on the drain region 14, the source region 12, and the major surface between the drain region 14 and the source region 12. A gate electrode 16, which is made of a conductive material, e.g. polycrystalline silicon, is formed on the gate oxide layer 30 between the drain region 14 and the source region 12.

An interlevel insulating layer 32 and a field oxide layer 34 are formed over the major surface. Contact holes 18 are defined in the interlevel insulating layer 32 and the gate oxide layer 30 over the source region 12 so that a portion (e.g., a side wall and the top side) of the gate electrode 16 is exposed and a portion of the source region 12 is exposed. (The contact holes 18 pass through the interlevel insulating layer 32 and the gate oxide layer 30.) A wiring 22 preferably made of aluminum is formed in the contact holes 18, whereby the gate electrode 16 is electrically connected to the source region 12 by the wiring 22.

The other contact holes 20 are defined on the drain region 14 in the interlevel insulation layer 32 and the gate oxide layer 30 so that a part of the drain region 14 is exposed. (The contact holes 20 pass through the interlevel insulating layer 32 and the gate oxide layer 30.) A wiring 24 preferably made of aluminum is formed in the contact holes 20.

As shown in FIG. 5, the drain region 14 is connected to the pad 504 and the internal circuitry 506 through the wiring 24 and the source region 12 and the gate electrode 16 are connected to the ground voltage GND through wiring 22.

In the first preferred embodiment, since there are no margins between the gate side edges of the contact holes 18 and the gate side edge of the source region 12, there is a possibility that the wiring 22 may be short circuited to the semiconductor substrate 10 beneath the source side edge of the gate electrode 16. However, since the source region 12, the gate electrode 16 and the semiconductor substrate 10 have to the same voltage potential applied to them, and whereby the NMOS transistor 202 serves as the protection element, there are not any problems with respect to the possibility of a short circuit. That is, the element structure of the present invention can function as the protection element by using the source region, the gate electrode and the semiconductor substrate which are applied to the same voltage potential. Not only the first preferred embodiment but also the other preferred embodiments have this structure.

In the first preferred embodiment of the present invention, since the contact holes are defined in the interlevel insulating layer and the gate oxide layer so that the portion of the gate electrode and the portion of the source region are exposed (that is, the wiring which is to be formed within the contact holes contacts the gate electrode and the source region) and the gate electrode and the source region are electrically connected to the wiring formed in the contact holes, only one kind of contact hole in which the wiring for contacting both the gate electrode and the source region is formed is needed. This means that special contact hole for only contacting the gate electrode is not needed. Therefore, the element area can be reduced.

Furthermore, since the gate side edge of the contact hole with respect to the source region is disposed so that the distance from the edge to the drain region is closer than that of the conventional protective element and thus the wiring in the contact hole is formed at the closer position to the drain region, an emitter resistance of the parasitic bipolar transistor occurred by the MOS transistor can be decreased. As a result, the surge current between the drain region and the source region flows more easily. The distance between a portion where the wiring of the source region contacts the source region and a portion where the wiring of the drain region contacts the drain region is also shorter than that of the conventional protective element. The surge current between the drain region and the drain region flows more easily. These means that the withstanding voltage against the electrostatic discharge damage is improved.

Second Preferred Embodiment

A semiconductor device according to a second preferred embodiment will be explained hereinafter with reference to FIG. 6 through FIG. 8.

Figure 6:
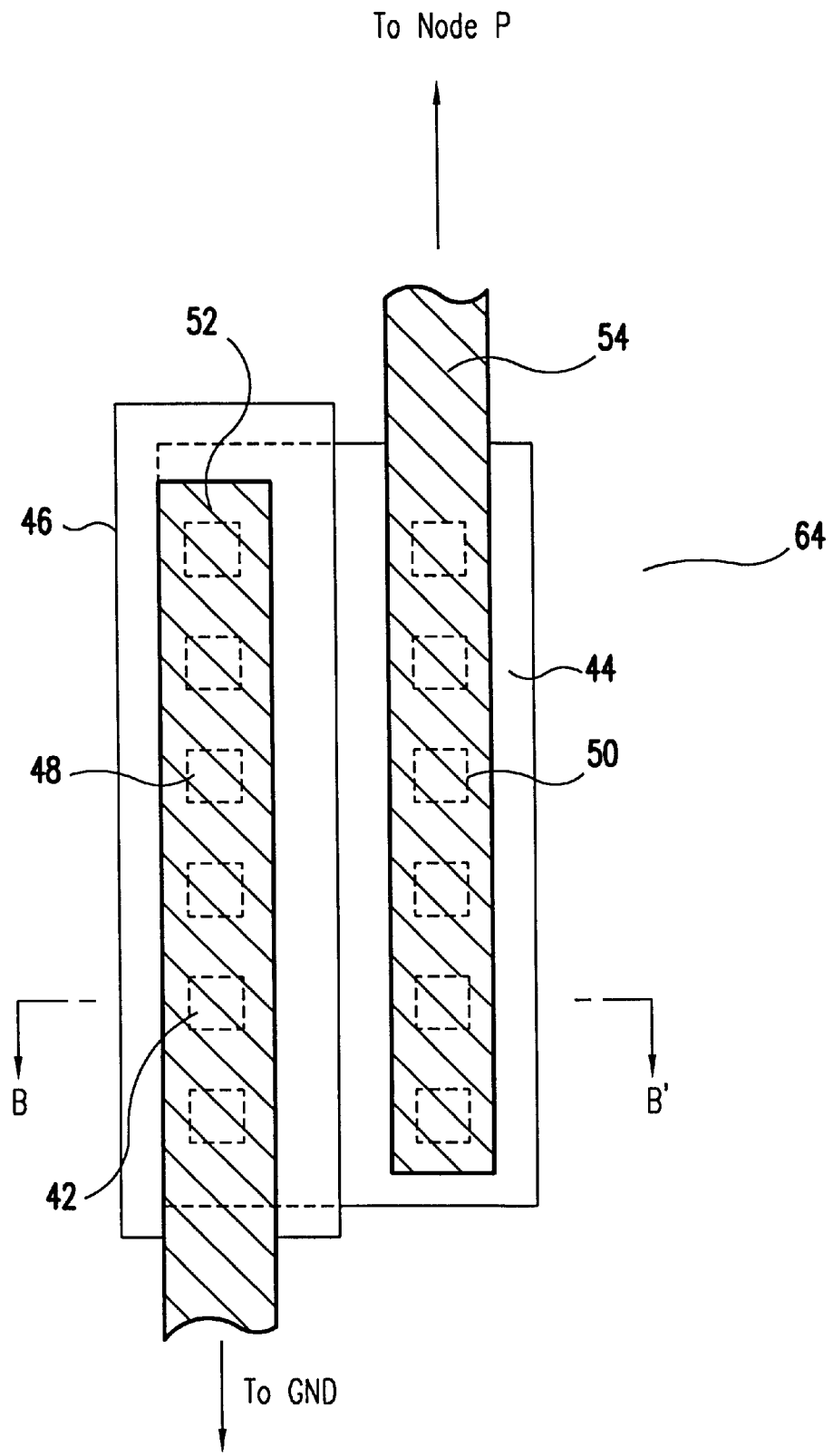
FIG. 6 is a top plan view showing a semiconductor device according to a second preferred embodiment of the present invention.
Figure 7:
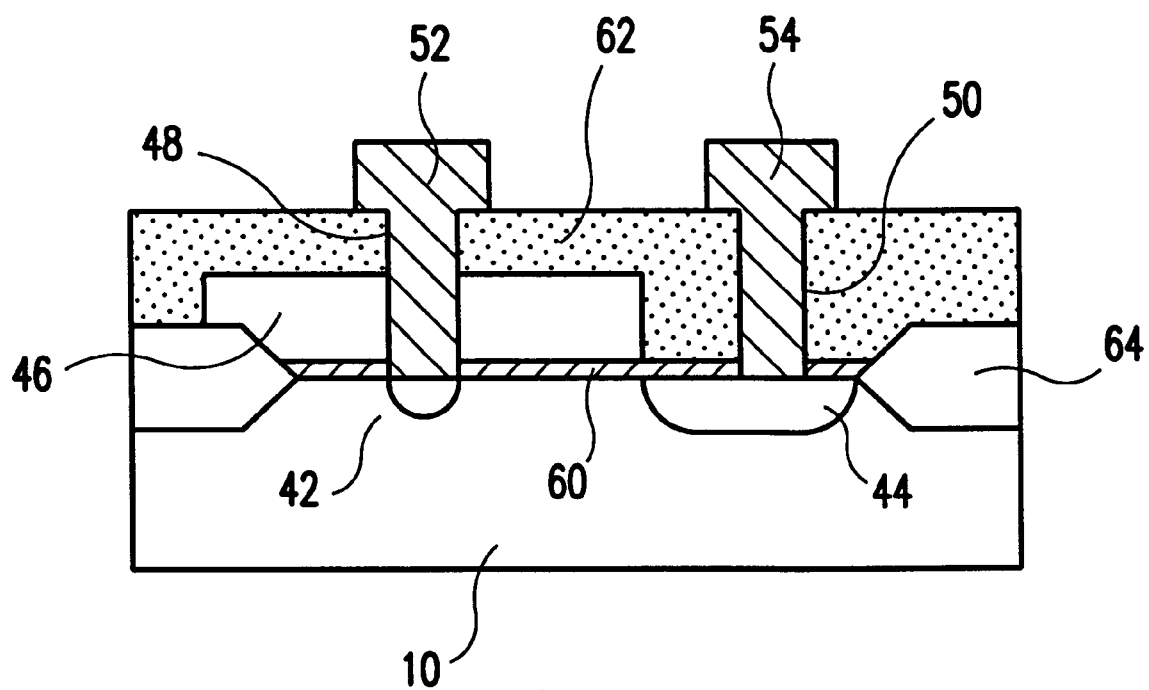
FIG. 7 is a cross sectional view taken on line B–B' of FIG. 6.

FIG. 6 is a top plan view showing a semiconductor device according to the second preferred embodiment. FIG. 7 is a cross sectional view taken on line B—B of FIG. 6. FIG. 8 is an equivalent circuit diagram showing a semiconductor device according to the second preferred embodiment.

Figure 8:
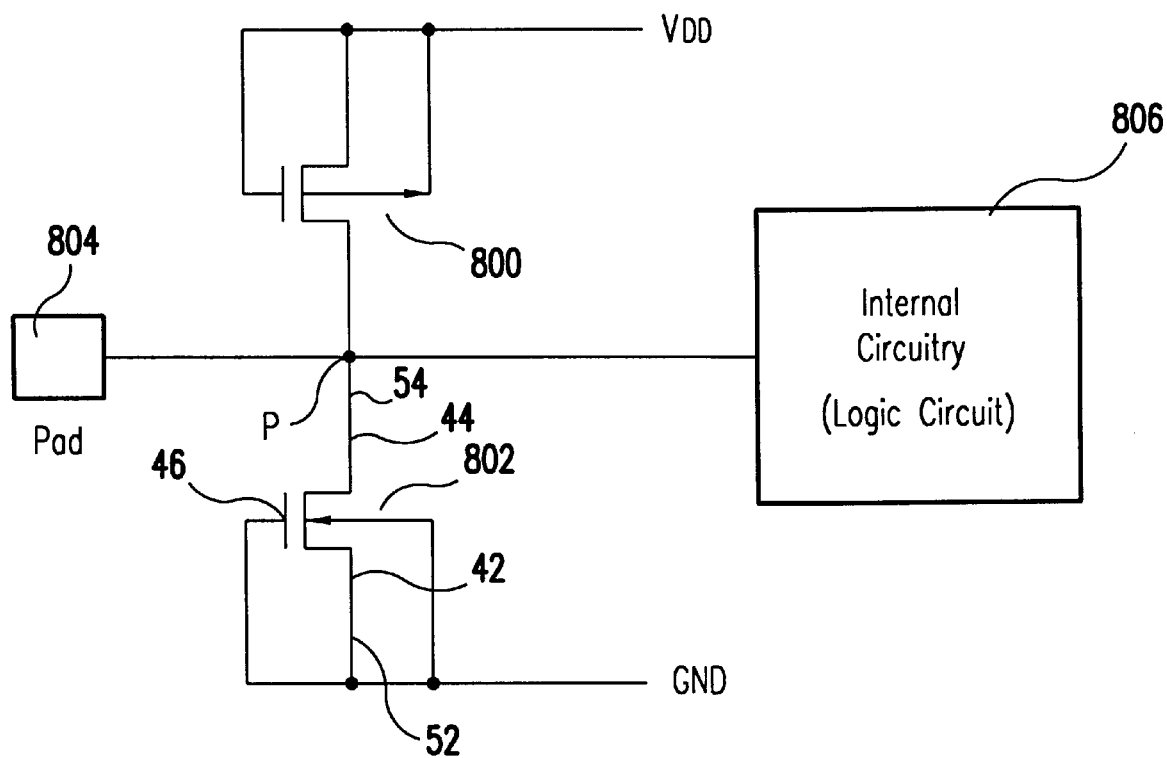
FIG. 8 is an equivalent circuit diagram according to a second preferred embodiment of the present invention.

As shown in FIG. 8, the semiconductor device according to the second preferred embodiment includes an NMOS transistor 802, a PMOS transistor 800, a pad 804, and an internal circuitry 806. In order to simplify explanations, since the PMOS transistor 800 and the NMOS transistor 802 have comparable structure, the explanations of the PMOS transistor 800 will be omitted.

In these figures, an n-type drain region 44 is formed on a major surface of a p-type semiconductor substrate 10. A gate oxide layer 60 is formed on the semiconductor substrate 10 including the drain region 44. A gate electrode 46 is formed so as to extend from an edge of the drain region 44 to the left direction as illustrated in FIG. 7. The gate electrode 46 is preferably made of, e.g., polycrystalline silicon.

An interlevel insulating layer 62 and a field oxide layer 64 are formed over the major surface.

Contact holes 48 are defined in the interlevel insulating layer 62, the gate electrode 46, and the gate oxide layer 60 so that portions of the major surface of the semiconductor substrate 10 are exposed. (The contact holes 48 pass through the interlevel insulating layer 62, the gate electrode 46, and the gate oxide layer 60.) N-type source regions 42 are formed at which these exposed portions of the major surface of the semiconductor substrate 10.

A wiring 52 preferably made of aluminum is formed in the contact holes 48, whereby the gate electrode 46 is electrically connected to the source regions 42 by the wiring 52.

The other contact holes 50 are defined on the drain region 44 in the interlevel insulation layer 62 and the gate oxide layer 60 so that a part of the drain region 44 is exposed. (The contact holes 50 pass through the interlevel insulating layer 62 and the gate oxide layer 60.) A wiring 54 preferably made of aluminum is formed in the contact holes 54.

The source regions 42 are formed by using well known ion implantation method and the like after the contact holes 48 have been already defined. Therefore, the source regions 42 exist only the underneath the wiring 52 in the contact holes 48.

As shown in FIG. 8, the drain region 44 is connected to the pad 804 and the internal circuitry 806 through the wiring 54 and the source regions 42 and the gate electrode 56 are connected to the ground voltage GND through wiring 52.

In the second preferred embodiment of the present invention, the contact holes are defined in the interlevel insulating layer, the gate electrode, and the gate oxide layer so that the areas where the source regions are to be formed are exposed and then the source regions are formed by utilizing the contact holes. Therefore, the self-alignment source region can be obtained. This means that the element area can be further reduced compared to the first preferred embodiment.

Third Preferred Embodiment

A semiconductor device according to a third preferred embodiment will be explained hereinafter with reference to FIG. 9 through FIG. 11.

Figure 9:
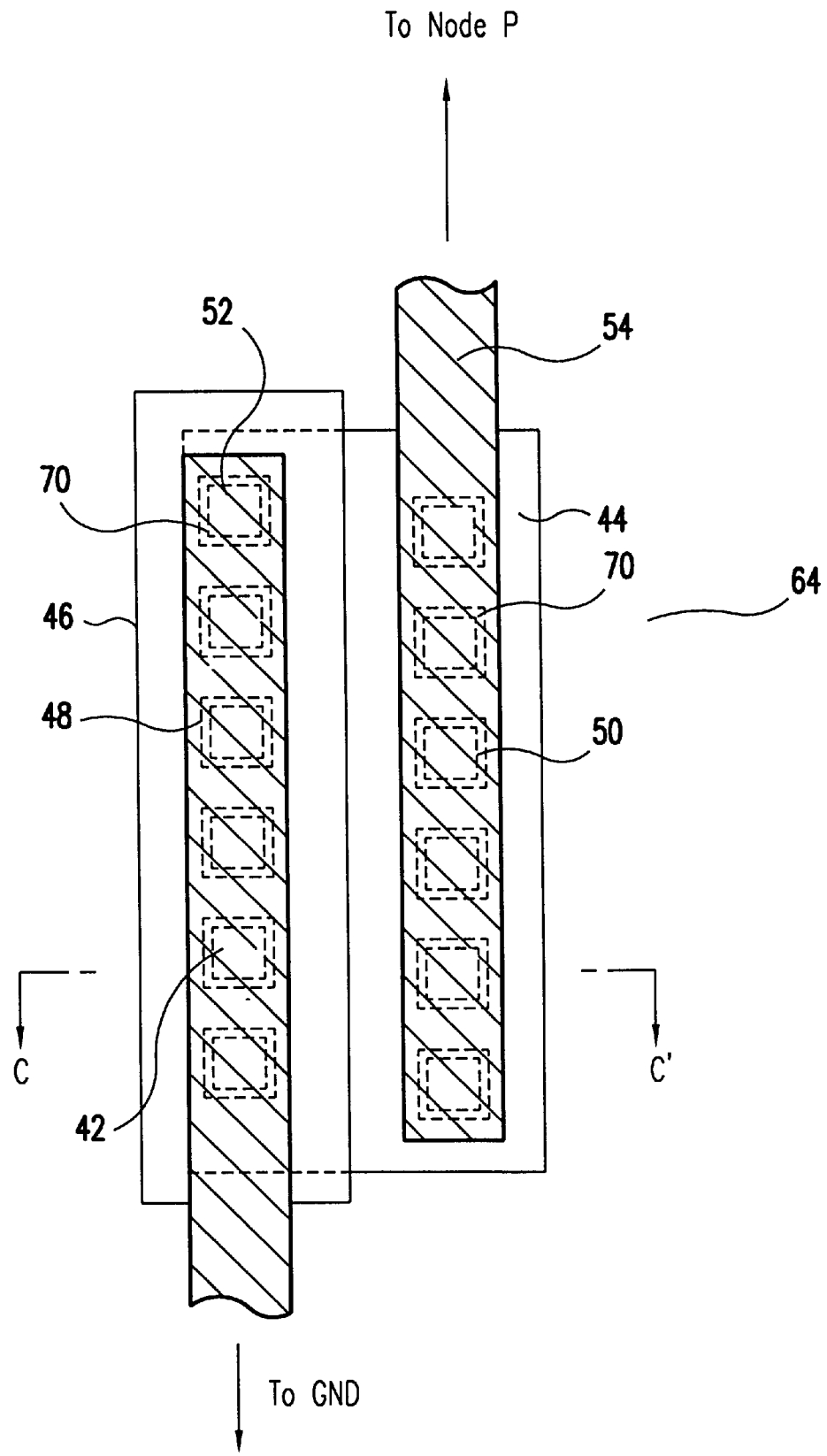
FIG. 9 is a top plan view showing a semiconductor device according to a third preferred embodiment of the present invention.

FIG. 9 is a top plan view showing a semiconductor device according to the third preferred embodiment. FIG. 10 is a cross sectional view taken on line C–C' of FIG. 9. FIG. 11 is an equivalent circuit diagram showing a semiconductor device according to the third preferred embodiment.

Figure 11:
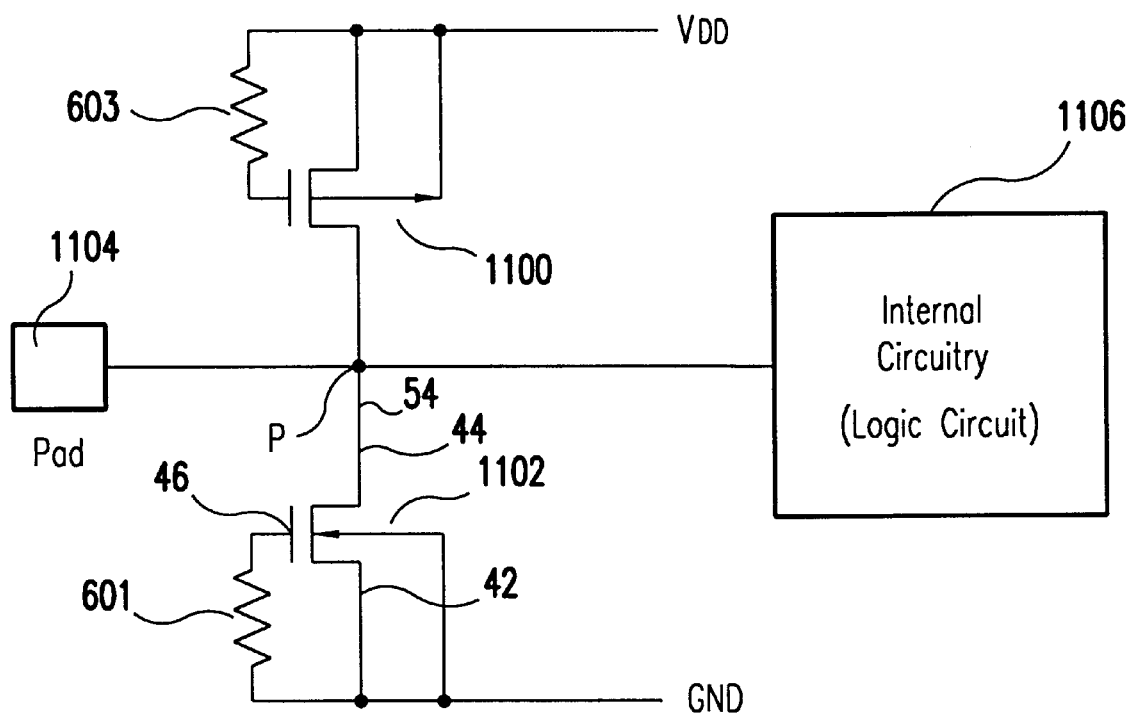
FIG. 11 is an equivalent circuit diagram of a third preferred embodiment of the present invention.

As shown in FIG. 11, the semiconductor device according to the third preferred embodiment includes an NMOS transistor 1102, a PMOS transistor 1100, a pad 1104, an internal circuitry 1106, and resistors 601 and 603. In order to simplify explanations, since the PMOS transistor 1100 and the NMOS transistor 1102 have comparable structure, the explanations of the PMOS transistor 1100 will be omitted.

The structural difference between the third preferred embodiment and the second preferred embodiment resides in conductive layers having relatively high resistance (hereinafter the high resistance conductive layer) which are formed on the side walls of the contact holes for the source regions. The conductive layers function as high resistance which connects the gate electrode to the wiring formed within the contact holes.

Since the other element of the third preferred embodiment are the same of that of the second preferred embodiment, like elements are given like or corresponding reference numerals and the explanations with respect to the same elements will be omitted.

Figure 10:
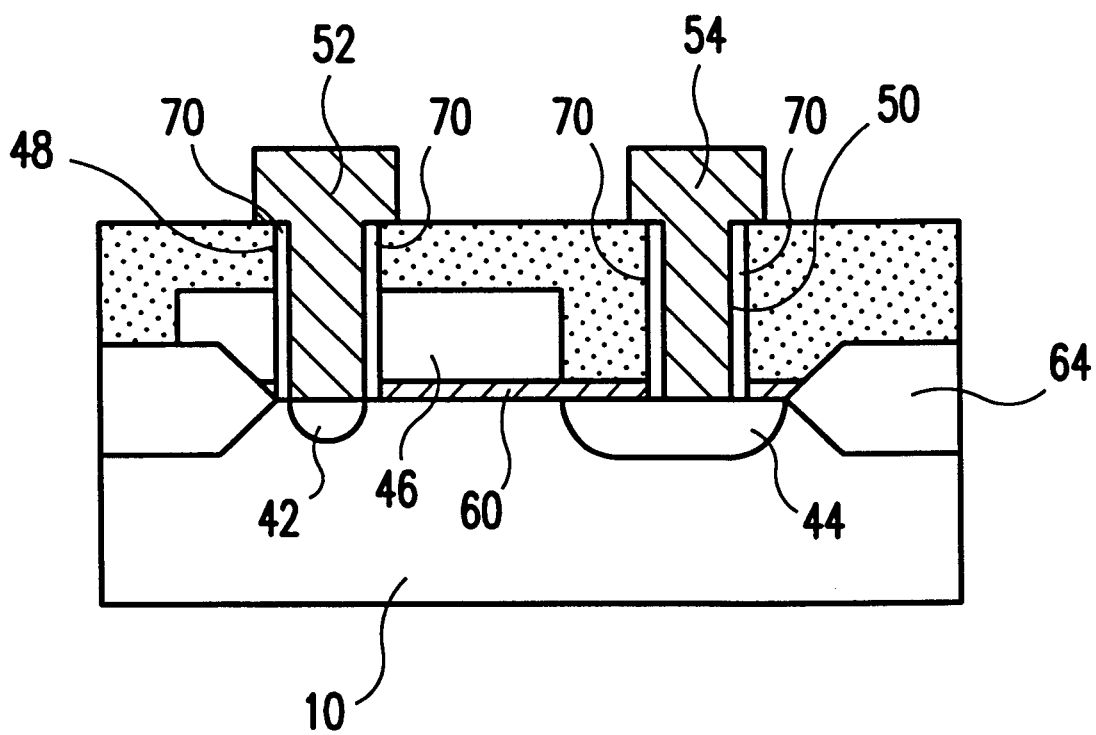
FIG. 10 is a cross sectional view taken on line C–C' of FIG. 9.

In FIG. 10, the contact holes 48 are defined in the interlevel insulating layer 62, the gate electrode 46, and the gate oxide layer 60 so that portions of the major surface of the semiconductor substrate 10 is exposed. (The contact holes 48 pass through the interlevel insulating layer 62, the gate electrode 46, and the gate oxide layer 60.)

The n-type source regions 42 are formed in these exposed portions of the major surface of the semiconductor substrate 10.

The high resistance conductive layers 70, which are preferably made of titanium nitride or the like, are formed on the side walls of the contact holes 48.

The wiring 52 preferably made of aluminum is formed in the contact holes 48, whereby the gate electrode 46 is electrically connected to the source regions 12 through the wiring 52 and the high resistance conductive layers 70.

The high resistance conductive layers 70 are also formed on the side walls of the contact holes 50 for the drain regions 44.

The wiring 54 preferably made of aluminum is formed in the contact holes 54.

The high resistance conductive layers 70 in the contact holes 50 are simultaneously formed when the high resistance conductive layers 70 are formed on the side walls of the contact holes 48. These high resistance conductive layers 70 are not necessary in the contact holes 50, however, they do not impair operation of the circuit so may remain to avoid additional processing steps.

Referring to FIG. 11, in the NMOS structure as mentioned above, the high resistance conductive layers 70 function as the resistor 601. In the PMOS structure not mentioned above, the high resistance conductive layers 70 function as the resistor 603.

In the third preferred embodiment of the present invention, the gate electrode and the source region are electrically connected to each other through the wiring in the contact hole and the high resistance conductive layer formed on the side wall of the contact hole. Therefore, the surge current, which flows from the wiring for source region to the drain region through the gate electrode and the gate oxide later can be reduced because of the resistance of the high resistance conductive layer. As a result, this structure prevents the gate oxide layer from being broken down by the surge current and thus the withstanding voltage against the electrostatic discharge can be improved.

Fourth Preferred Embodiment

A semiconductor device according to a fourth preferred embodiment will be explained hereinafter with reference to FIG. 12 through FIG. 14.

Figure 12:
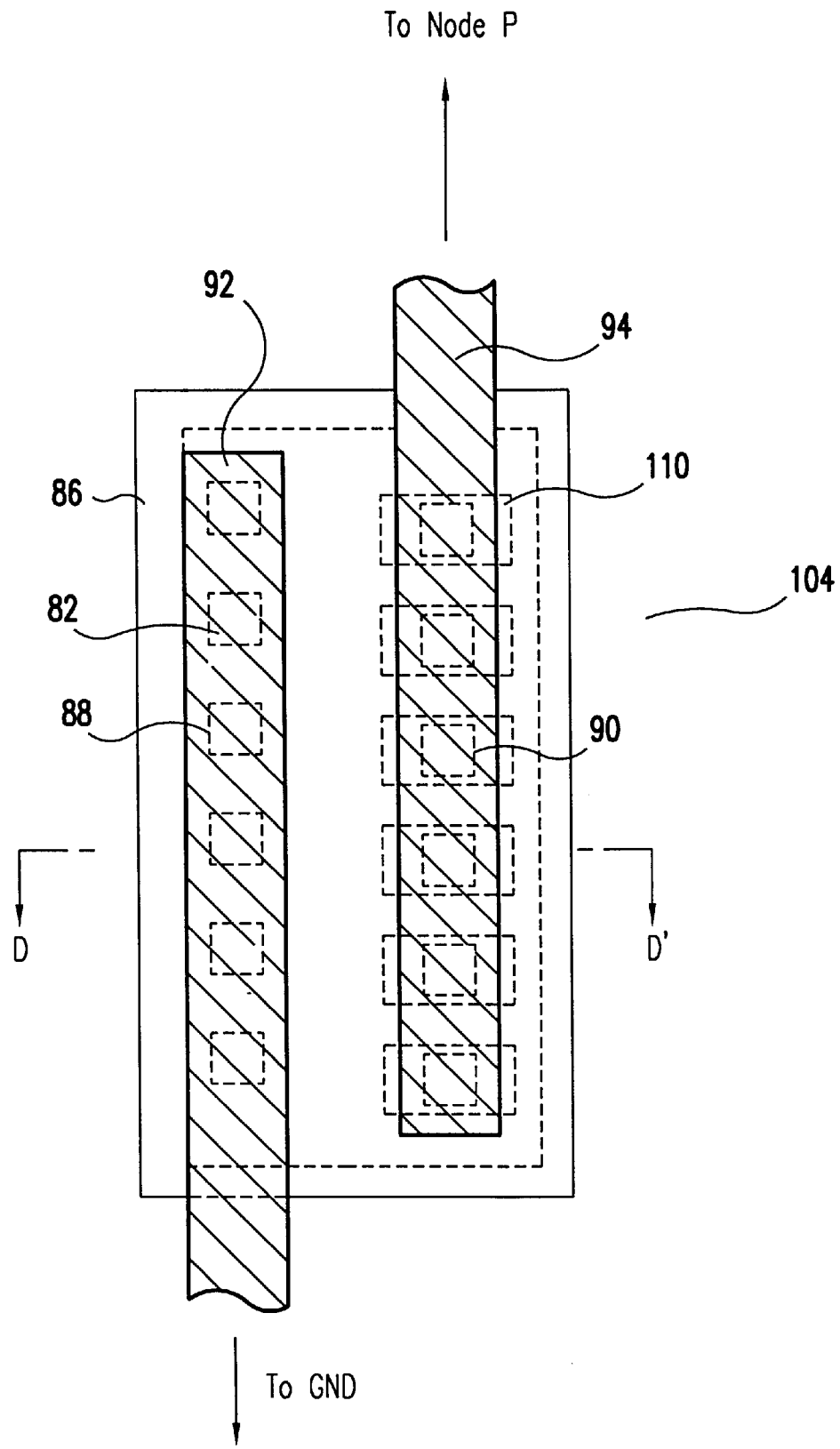
FIG. 12 is a top plan view showing a semiconductor device according to a fourth preferred embodiment of the present invention.
Figure 13:
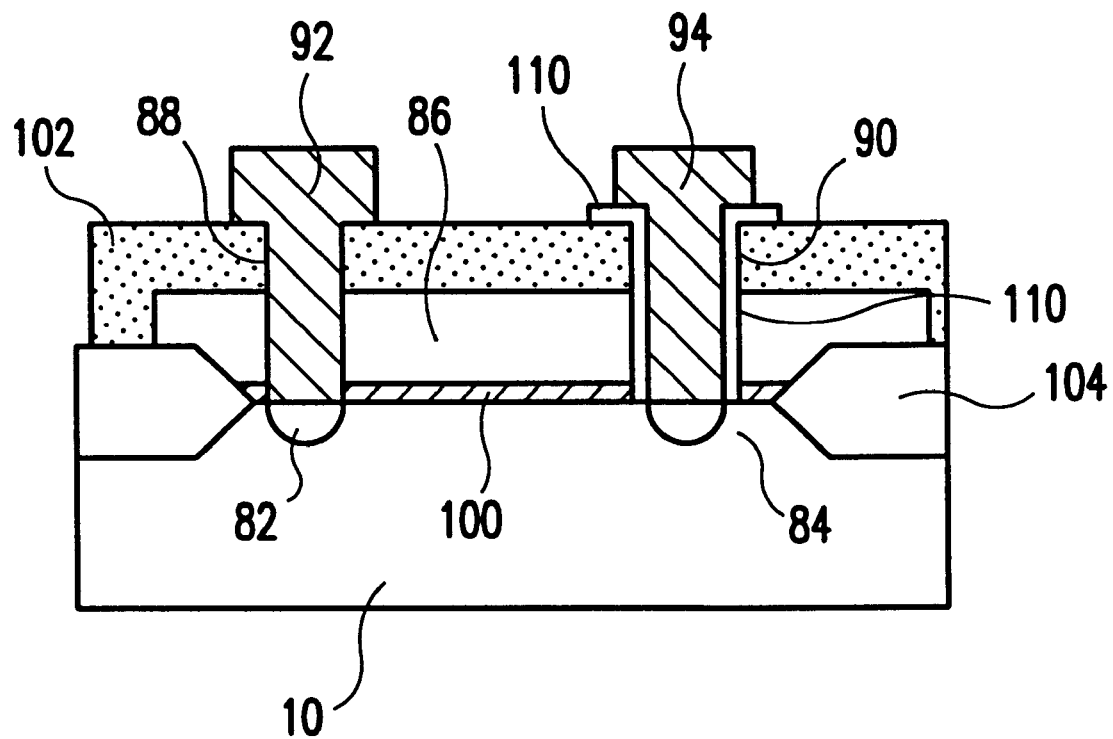
FIG. 13 is a cross sectional view taken on line D–D' of FIG. 12.

FIG. 12 is a top plan view showing a semiconductor device according to the fourth preferred embodiment. FIG. 13 is a cross sectional view taken on line D–D' of FIG. 12. FIG. 14 is an equivalent circuit diagram showing a semiconductor device according to the fourth preferred embodiment.

Figure 14:
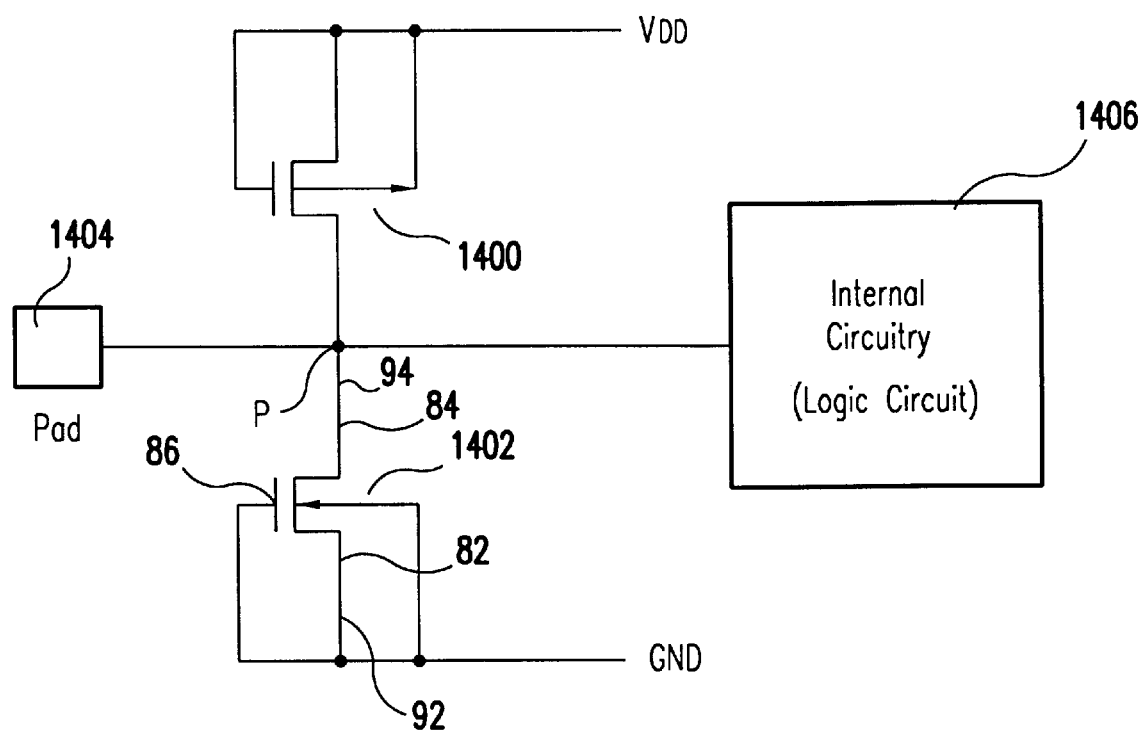
FIG. 14 is an equivalent circuit diagram of a fourth preferred embodiment of the present invention.

As shown in FIG. 14, the semiconductor device according to the fourth preferred embodiment includes an NMOS transistor 1402, a PMOS transistor 1400, a pad 1404, and an internal circuitry 1406. In order to simplify explanations, since the PMOS transistor 1400 and the NMOS transistor 1402 have comparable structure, the explanations of the PMOS transistor 1400 will be omitted.

In these figures, a gate oxide layer 100 is formed on the major surface of the semiconductor substrate 10 and a gate electrode 86 is formed on the gate oxide layer 100.

An interlevel insulating layer 102 and a field oxide layer 104 are formed over the major surface.

Contact holes 88 are defined in the interlevel insulating layer 102, the gate electrode 86, and the gate oxide layer 100 so that portions of the major surface of the semiconductor substrate 10 are exposed. (The contact holes 88 pass through the interlevel insulating layer 102, the gate electrode 86, and the gate oxide layer 100.)

N-type source regions 82 are formed in these exposed portions of the major surface of the semiconductor substrate 10.

A wiring 92 preferably made of aluminum is formed in the contact holes 88, whereby the gate electrode 46 is electrically connected to the source regions 82 through the wiring 92.

The source regions 82 are formed by using well known ion implantation method and the like after the contact holes 88 have been already defined. Therefore, the source regions 82 exist only the underneath the wiring 92 in the contact holes 88.

The other contact holes 90 are defined in the interlevel insulating layer 102, the gate electrode 86, and the gate oxide layer 100 so that portions of the major surface of the semiconductor substrate 10 are exposed. (The contact holes 90 pass through the interlevel insulating layer 102 and the gate oxide layer 100.) A wiring 94 preferably made of aluminum is formed in the contact holes 90.

Insulating layers 110 are formed on the side walls of the contact holes 90.

A wiring 94 preferably made of aluminum is formed in the contact holes 90, whereby the gate electrode 86 is electrically connected to the drain regions 84 though the insulating layers 110 and the wiring 94.

The drain regions 84 are formed by using a well known ion implantation method and the like after the contact holes 90 have been already defined. Therefore, the drain regions 84 exist only the underneath the wiring 94 in the contact holes 90.

As shown in FIG. 14, the drain region 84 is connected to the pad 1404 and the internal circuitry 1406 through the wiring 94 and the source regions 82 and the gate electrode 86 are connected to the ground voltage GND through wiring 92.

In the fourth preferred embodiment of the present invention, first contact holes are defined in the interlevel insulating layer, the gate electrode, and the gate oxide layer so that the areas where the source regions are to be formed are exposed and then the source regions are formed by utilizing the first contact holes. Second contact holes are defined in the interlevel insulating layer the gate electrode, and the gate oxide layer so that the areas where the drain regions are to be formed are exposed and then the drain regions are formed by utilizing the second contact holes. Furthermore, the insulating layer are formed on the side walls of the second contact holes. Accordingly, the self-alignment of source and drain regions can be obtained. This means that the element area can be further reduced, because the margins between the first contact holes and the source regions and the margins between the second contact holes and the drain regions are not needed.

Fifth Preferred Embodiment

A semiconductor device according to a fifth preferred embodiment will be explained hereinafter with reference to FIG. 15 through FIG. 17.

Figure 15:
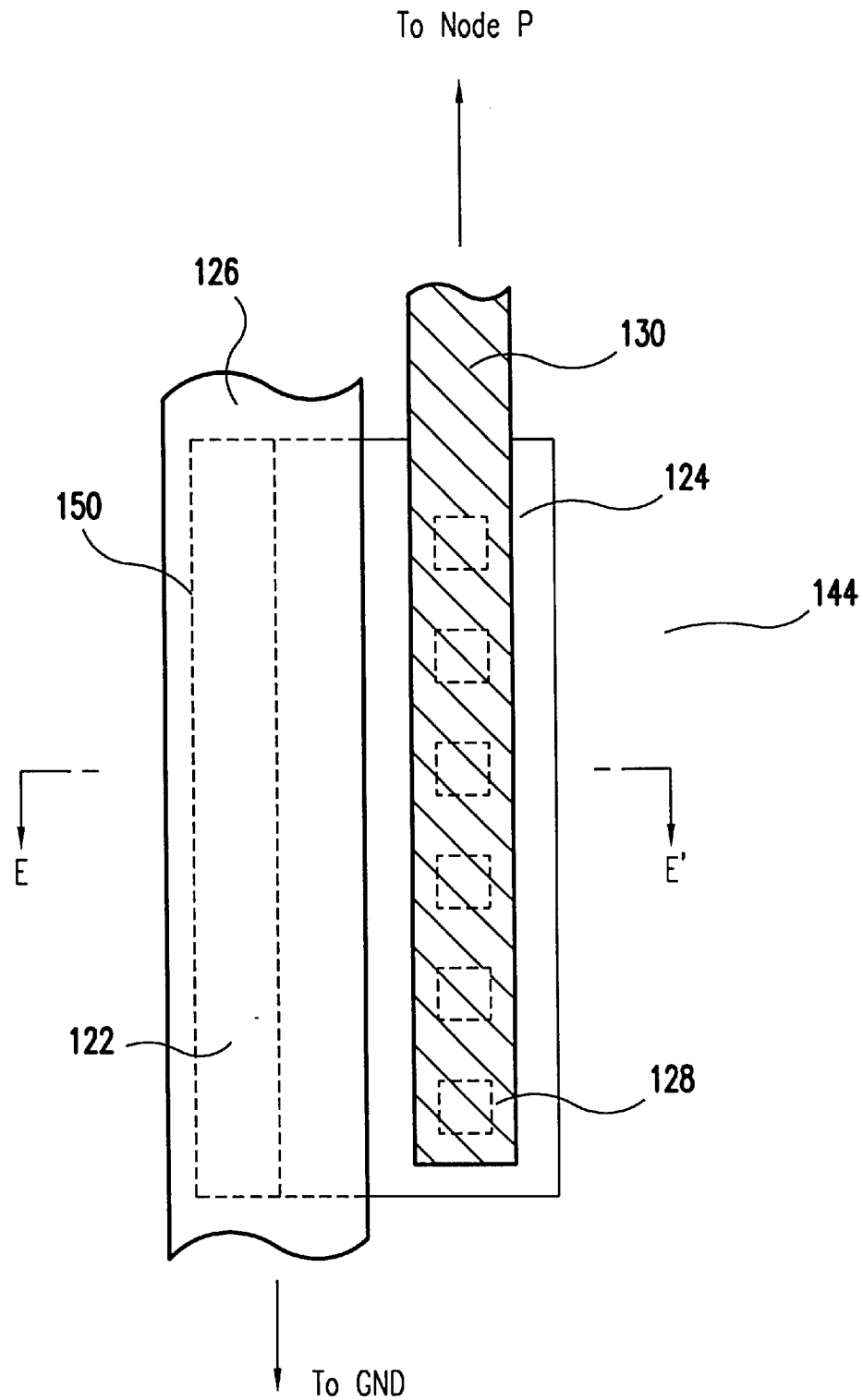
FIG. 15 is a top plan view showing a semiconductor device according to a fifth preferred embodiment of the present invention.
Figure 16:
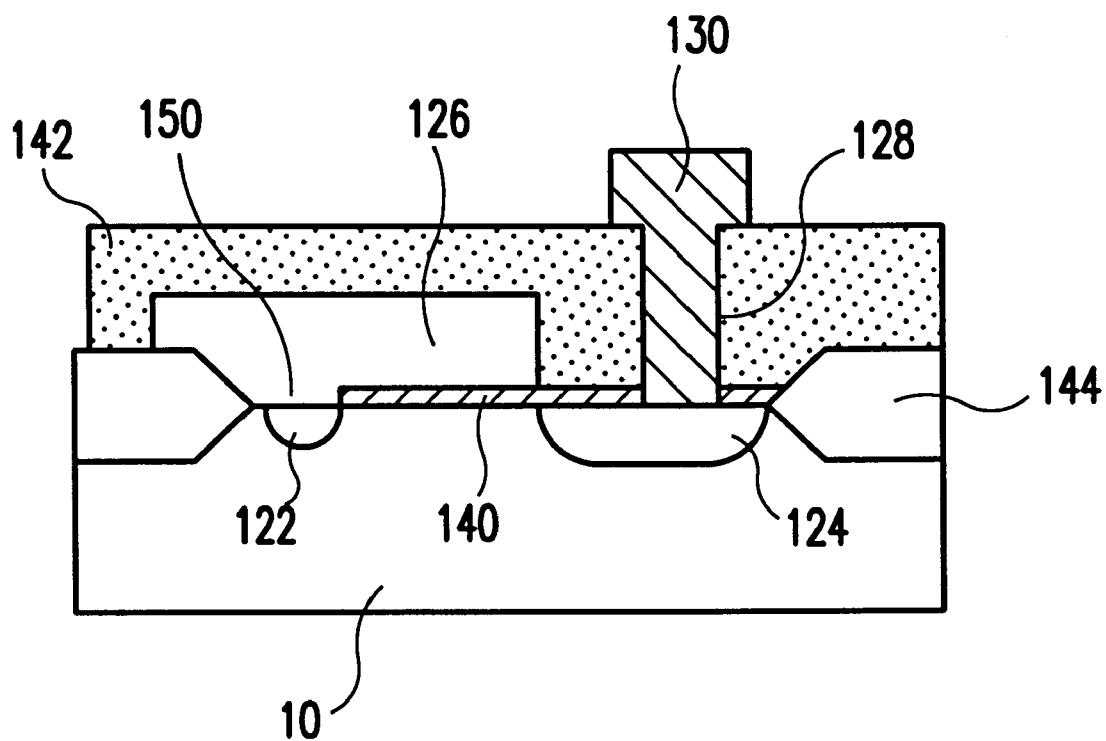
FIG. 16 is a cross sectional view taken on line E–E' of FIG. 15.

FIG. 15 is a top plan view showing a semiconductor device according to the fifth preferred embodiment. FIG. 16 is a cross sectional view taken on line E–E' of FIG. 15. FIG. 17 is an equivalent circuit diagram showing a semiconductor device according to the fifth preferred embodiment.

Figure 17:
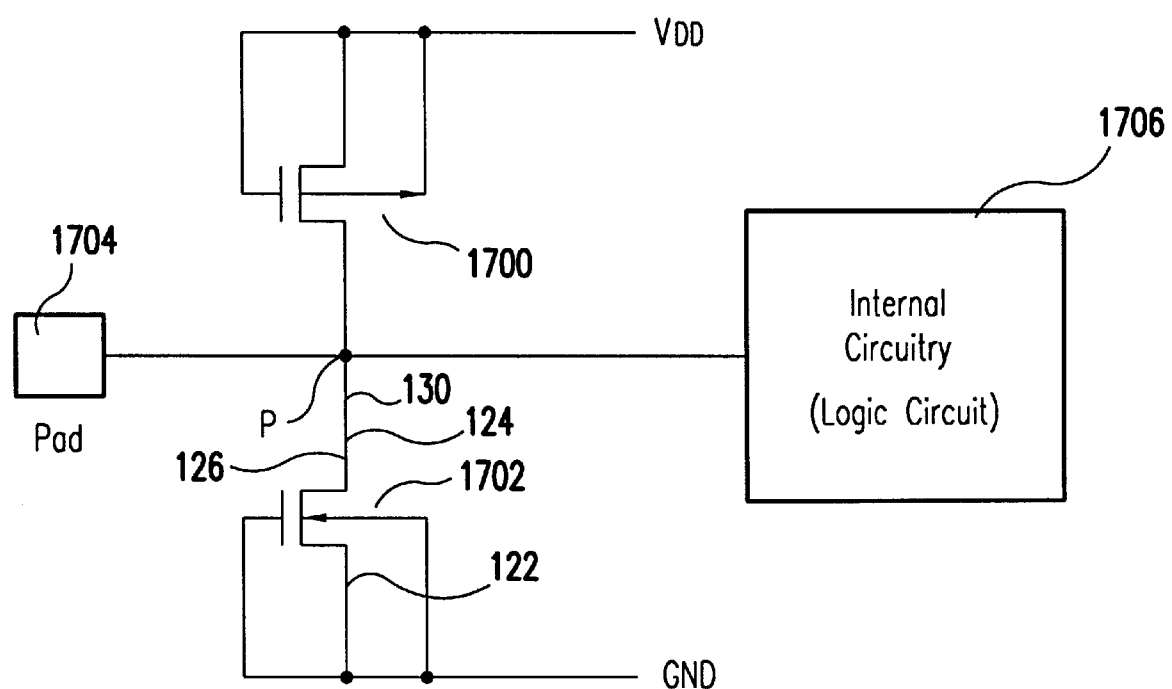
FIG. 17 is an equivalent circuit diagram of a fifth preferred embodiment of the present invention.

As shown in FIG. 17, the semiconductor device according to the fifth preferred embodiment includes an NMOS transistor 1702, a PMOS transistor 1700, a pad 1704, and an internal circuitry 1706. In order to simplify explanations, since the PMOS transistor 1700 and the NMOS transistor 1702 have comparable structure, the explanations of the PMOS transistor 1700 will be omitted.

In these figures, an n-type source region 122 and an n-type drain region 124 are formed on a major surface of the p-type semiconductor substrate 10 so that the source region 122 and the drain region 124 are spaced away from each other.

A gate oxide layer 140 is formed on the drain region 124 and the major surface between the drain region 124 and the source region 122. A gate electrode 126, which is made of, for example, polycrystalline silicon, is formed on the gate oxide layer 140 and the source region 122 and thus the gate electrode 126 is electrically connected to the source region 122. In this embodiment, the gate electrode itself preferably functions as a wiring supplying the ground voltage GND.

An interlevel insulating layer 142 and a field oxide layer 144 are formed over the major surface.

Contact holes 128 are defined in the interlevel insulation layer 142 on the drain region 124 and the gate oxide layer 140 so that parts of the drain region 124 are exposed. (The contact holes 128 pass through the interlevel insulating layer 142 and the gate oxide layer 140.) A wiring 130 preferably made of aluminum is formed in the contact holes 128.

As shown in FIG. 17, the drain region 124 is connected to the pad 1704 and the internal circuitry 1706 through the wiring 130. The source region 122 is connected to the gate electrode 126 applied to the ground voltage GND.

In the fifth preferred embodiment of the present invention, since the gate electrode itself is utilized as the wiring which directly connects the gate electrode to the source region, it is not necessary to provide such an extra wiring for connecting the gate electrode to the source region.

Therefore, the limitation of the wiring pattern layout on the drain region can be eased.

Furthermore, the protection element may be located under the aluminum wiring from the pad or the pad itself without using a multiple layered wiring. This means that the IC chip area can be reduced.

In each of the embodiments as described above, an NMOS transistor is explained as the MOS transistor of the protection element, however, the PMOS transistor may also be used in the present invention. In this case, the conductivity types of the source region, the drain region, and the semiconductor substrate in the embodiments are changed to the p-type, the p-type, and the n-type respectively.

In the embodiments, the MOS transistor structure having one source region and one drain region is explained, however, the source region, the drain region, and the gate electrode of the MOS transistor may be changed to the comblike structure as illustrated in FIG. 12. In this case, the element area can be further reduced.

In the third preferred embodiment, the high resistance conductive layers 70, which are formed on the side wall of the contact holes 48, can be formed by using a well known side wall spacer forming technique.

In the fourth preferred embodiment, the insulating layers 110, which are formed on the side wall of the contact holes 90, can be formed by using a conventional insulating layer forming technique and a conventional patterning technique.

In the embodiments, the distance between the source region and the drain region is preferably set so that the punch through withstanding voltage of the protection element is larger than the operation voltage of the internal circuitry. (The operation voltage of the internal circuitry is, for example, 5V or 3.3V)

In the second and the third preferred embodiments, the effective base width of the parasitic bipolar transistor can be increased by increasing the number of contact holes for the source regions or by increasing the length of the contact hole edges for the source regions at the drain region side. Therefore, the withstanding voltage against the electrostatic discharge is further improved.

In the fourth embodiment the withstanding voltage against the electrostatic discharge is further improved by arranging the contact holes for the source regions so that they are located opposite to the contact holes for the drain regions.

While the preferred form of the present invention has been described, it is to be understood that modifications will be apparent to those skilled in the art without departing from the spirit of the invention.

The scope of the invention, namely, is to be determined solely by the following claims.

What is claimed is:

1. A semiconductor device comprising:
    a semiconductor substrate having a major surface and including a first region of a first conductivity type, said first region being formed in the major surface;
    a first source region of a second conductivity type and which is formed in the first region;
    a first drain region of the second conductivity type and which is formed in the first region, and spaced from said source region;
    a first insulating layer formed over the major surface between said first source region and said first drain region;
    a first control electrode layer formed over the first insulating layer;
    a second insulating layer formed over the first region and having first and second contact holes defined in said second insulating layer, wherein the first contact hole exposes a portion of said first source region and a portion of said first control electrode layer, and wherein the second contact hole expose a portion of said first drain region;
    an internal circuitry executing a predetermined operation;
    a pad receiving a signal from said internal circuitry or a signal from an external device;
    a first wiring layer formed in the first contact hole and applied with a first supply voltage level; and
    a second wiring layer formed in the second contact hole and connected to said pad and said internal circuitry.

2. A semiconductor device as set forth claim 1, wherein said first wiring layer contacts top and side portions of said first control electrode layer.

3. A semiconductor device as set forth claim 1, wherein the first supply voltage level is a ground voltage.

4. A semiconductor device as set forth claim 1, wherein the first conductivity type is p-type and the second conductivity type is n-type.

5. A semiconductor device as set forth claim 1, wherein the first supply voltage level is applied to the first region.

6. A semiconductor device as set forth claim 1, further comprising:
    a second region of the second conductivity type formed in said semiconductor substrate, said second region being formed in the major surface;
    a second source region of the first conductivity type and which is formed in the second region;
    a second drain region of the first conductivity type, formed in the second region, and spaced from said second source region;
    a third insulating layer formed over the major surface between said second source region and said second drain region;
    a second control electrode layer formed over the third insulating layer;
    wherein said second insulating layer is further formed over the second region and further having third and fourth contact holes defined in said second insulating layer, wherein the third contact hole exposes a portion of said second source region and a portion of said second control electrode layer, and wherein the fourth contact hole expose a portion of said second drain region;
    a third wiring layer formed in the third contact hole and applied with a second supply voltage level; and
    a fourth wiring layer formed in the fourth contact hole and connected to said pad and said internal circuitry.

7. A semiconductor device as set forth claim 6, wherein said third wiring layer contacts top and side portions of said second control electrode layer.

8. A semiconductor device as set forth claim 6, wherein the second supply voltage level is a power supply voltage.

9. A semiconductor device as set forth claim 6, wherein the first conductivity type is p-type and the second conductivity type is n-type.

10. A semiconductor device as set forth claim 6, wherein the second supply voltage level is applied to the second region.

11. A semiconductor device comprising:
a semiconductor substrate having a major surface and including a first region of a first conductivity type, said first region being formed in the major surface;
a source region of a second conductivity type and which is formed in a second region within the first region;
a drain region of the second conductivity type formed in a third region within the first region, the third region being spaced from the second region;
a first insulating layer formed over a fourth region surrounding the second region;
a control electrode layer formed over the first insulating layer;
a second insulating layer formed over the first region and having first and second contact holes which are defined in said second insulating layer, wherein the first contact hole exposes said source region and a portion of said control electrode layer, and wherein the second contact hole expose a portion of said drain region;
a first wiring layer formed in the first contact hole and applied with a first supply voltage level;
an internal circuitry executing a predetermined operation;
a pad receiving a signal from said internal circuitry or a signal from an external device; and
a second wiring layer formed in the second contact hole and connected to said pad and said internal circuitry.

12. A semiconductor device as set forth claim 11, wherein said first wiring layer contacts an inside portion of said control electrode layer.

13. A semiconductor device as set forth claim 11, wherein the first supply voltage level is a ground voltage.

14. A semiconductor device as set forth claim 11, wherein the first conductivity type is p-type and the second conductivity type is n-type.

15. A semiconductor device as set forth claim 11, wherein said source region further comprises a plurality of source regions of the second conductivity type formed in the second regions.

16. A semiconductor device as set forth claim 15, wherein said source regions are arranged in a line substantially parallel to said drain region.

17. A semiconductor device as set forth claim 11, further comprising a high resistance conductive layer formed on an inside wall of said control electrode layer in the first contact hole.

18. A semiconductor device as set forth claim 11, wherein the first supply voltage level is applied to the first region.

19. A semiconductor device comprising:
a semiconductor substrate having a major surface and including a first region of a first conductivity type, said first region being formed in the major surface;
a source region of a second conductivity type and which is formed in a second region within the first region;
a drain region of the second conductivity type and which is formed in a third region within the first region, the third region being spaced from the second region;
a first insulating layer formed over a fourth region surrounding the second and the third regions;
a control electrode layer formed over the first insulating layer;
a second insulating layer formed over the first region and having first and second contact holes which are defined in said second insulating layer, wherein the first contact hole exposes said source region and a first portion of said control electrode layer, and wherein the second contact hole expose said drain region and a second portion of said control electrode;
a third insulating layer formed over the second portion of said control electrode layer;
a first wiring layer formed in the first contact hole and which is applied with a first supply voltage level;
an internal circuitry executing a predetermined operation;
a pad receiving a signal from said internal circuitry or a signal from an external device; and
a second wiring layer for med in the second contact hole and which is connected to said pad and said internal circuitry.

20. A semiconductor device as set forth claim 19, wherein said first wiring layer contacts the first portion of said control electrode layer.

21. A semiconductor device as set forth claim 19, wherein the first supply voltage level is a ground voltage.

22. A semiconductor device as set forth claim 19, wherein the first conductivity type is p-type and the second conductivity type is n-type.

23. A semiconductor device as set forth claim 19, wherein said source region further comprises a plurality of source regions of the second conductivity type and formed in the second regions and wherein said drain region further comprises a plurality of drain regions of the second conductivity type and formed at the third regions within the fourth region.

24. A semiconductor device as set forth claim 23, wherein said source regions and said drain regions are each arranged in a line and are arranged substantially parallel to each other.

25. A semiconductor device as set forth claim 19, wherein the first supply voltage level is applied to the first region.

26. A semiconductor device comprising:
a semiconductor substrate having a major surface and including a first region of a first conductivity type said first region being formed in the major surface;
a source region of a second conductivity type and which is formed in the first region;
a drain region of the second conductivity type and which is formed in the first region, and which is spaced from said source region;
a first insulating layer formed over the major surface between said source region and said drain region;
a control electrode layer formed over the first insulating layer and a part of said source region and which is applied with a first voltage level;
a second insulating layer formed over the first region and having a contact hole defined in said second insulating layer, wherein the second contact hole exposes a portion of said drain region;
an internal circuitry executing a predetermined operation;
a pad receiving a signal from said internal circuitry or a signal from an external device; and
a wiring layer formed in the contact hole and connected to said pad and said internal circuitry.

27. A semiconductor device as set forth claim 26, wherein the first supply voltage level is a ground voltage.

28. A semiconductor device as set forth claim 26, wherein the first conductivity type is p-type and the second conductivity type is n-type.

29. A semiconductor device as set forth claim 26, wherein the first supply voltage level is applied to the first region.

* * * * *